United States Patent [19]

Filter et al.

[11] Patent Number: 4,814,933
[45] Date of Patent: Mar. 21, 1989

[54] POTENTIAL INDICATING DEVICE

[76] Inventors: Reinhard Filter, 14 Charles Street, Georgetown, Ontario L7G 2Z2; Claude G. Maurice, 26 Kirkland Road, Brampton, Ontario L6V 2W6, both of Canada

[21] Appl. No.: 163,003

[22] Filed: Feb. 25, 1988

[51] Int. Cl.[4] .............................................. G01R 19/14
[52] U.S. Cl. ................................. 361/86; 361/88; 324/133; 340/660; 340/663
[58] Field of Search ........................... 361/86, 88, 92; 324/133; 340/660

[56] References Cited

U.S. PATENT DOCUMENTS

| | | | |
|---|---|---|---|
| 3,513,394 | 5/1970 | Tachick | 324/133 |
| 4,251,770 | 2/1981 | Schweitzer, Jr. | 324/133 |
| 4,263,550 | 4/1981 | Schweitzer, Jr. | 324/133 |
| 4,321,543 | 3/1982 | Tuska | 324/133 X |
| 4,375,617 | 3/1983 | Schweitzer, Jr. | 324/133 |
| 4,438,403 | 3/1984 | Schweitzer, Jr. | 324/133 |
| 4,458,198 | 7/1984 | Schweitzer, Jr. | 324/133 |
| 4,550,282 | 10/1985 | Schweitzer, Jr. | 324/133 |

FOREIGN PATENT DOCUMENTS

| | | |
|---|---|---|
| 815701 | 6/1969 | Canada . |
| 1171909 | 11/1982 | Canada . |
| 1183212 | 11/1982 | Canada . |
| 1203574 | 11/1982 | Canada . |

*Primary Examiner*—Gerald P. Tolin
*Assistant Examiner*—Derek S. Jennings
*Attorney, Agent, or Firm*—Ridout & Maybee

[57] ABSTRACT

A potential indicating device for indicating the presence of a voltage on a connector in a high voltage electrical distribution system, the connector including a conductor, a semiconductive shield and a test point terminal. The device comprises two separate indicator circuits, each energized by a different voltage capacitively coupled to the conductor. When a voltage is present in the conductor, first circuit means transmits a voltage capacitively coupled to the test point terminal to a visible indicator which flashes intermittently, and second circuit means transmits a voltage capacitively coupled to the semiconductive shield to an audible indicator when switching means closes the second circuit means. Preferably switching means comprises a photosensitive transistor normally shielded from light by a removable plug.

9 Claims, 2 Drawing Sheets

4,814,933

POTENTIAL INDICATING DEVICE

FIELD OF THE INVENTION

The present invention relates to a potential indicating device for indicating the presence of a voltage on a connector in a high voltage electrical distribution system.

BACKGROUND OF THE INVENTION

High voltage electrical distribution systems utilize connectors, commonly known as "loadbreak elbows", at junctures of the conductors transmitting the current. Such a connector typically comprises a conductor surrounded by an insulating layer, a semiconductive layer and then an insulating sheath, all encased in a semiconductive outer shield, and includes a test point terminal embedded in the insulating sheath and exposed for contact from outside of the shield. A voltage on the conductor capacitively couples a first voltage on the test point terminal and a second voltage on the outer shield.

Service personnel commonly encounter difficulty in reliably determining whether or not a voltage is present on a loadbreak elbow. This is of considerable importance, since the safety of service personnel effecting service on such a system may depend upon the reliability of a status indicator correctly indicating the status of the connector to prevent electrical shock hazards.

A variety of indicating devices for such purpose are known. Capacitance indicators, typically a length of insulating tube with a metal probe at one end and a metal handle at the other, are designed to detect a voltage difference between the user's body and the object being tested. This type of device often has the disadvantage of requiring a power source independent of the conductor to drive the sensing mechanism, and further requires direct contact with the energized conductor. Moreover, the capacitance between the user's hand and the probe handle or the user and ground, being part of the measuring circuit, can affect the instrument's sensitivity.

Electronic indicators are the most commonly used indicators. An alternating electric field is detected, and the voltage reading is compared with a reference voltage. If the difference between the detected voltage and the reference voltage exceeds a preselected value, a battery powered indicator is activated. These devices require a power source independent of the conductor and further must be carefully calibrated. They are subject to errors from stray electric fields, and are usually complex and expensive.

Resistance indicators essentially comprise a voltmeter with one terminal grounded, which detects a voltage by direct contact with a high voltage-line. These devices, like capacitance indicators, must be carefully employed in order to avoid electrical shock, and draw a current from the conductor being tested which can affect the voltage reading.

All of the indicating devices mentioned above must be transported with service personnel, and must have associated a self test feature or some other means of indicating to service personnel that the indicating device is operational. In the absence of such a feature, failure of the device could indicate a false voltage status which may lead service personnel to assume that there is no voltage on the conductor when a voltage is in fact present, which presents an obvious safety hazard. However, the provision of a self test feature in indicating devices which do not operate from a power source external to the conductor is difficult and requires additional circuitry which renders these devices more complex and bulky.

SUMMARY OF THE INVENTION

These disadvantages are overcome by the present invention, which in a preferred embodiment provides a potential indicating device having at least two separate indicator circuits, each of which is energized by a different voltage capacitively coupled to the conductor. This obviates the need for an independent power source such as a battery, yet provides a reliable indication of status, since the probability of failure of both indicator circuits at the same time is extremely low. The device is further economic and compact, and can be permanently installed on the loadbreak elbow to provide a voltage status indication whenever desired by service personnel.

In particular, the present invention provides a potential indicating device for indicating the presence of a voltage on a connector in a high voltage distribution system, comprising a housing having a window for viewing a visible indicator, containing a first circuit means having input terminals connected to the test point terminal and ground, respectively, and output terminals connected to a first visible indicator, and a second circuit means having input terminals connected to the connector shield and ground, respectively, and output terminals connected to a second indicator, wherein an alternating voltage on the conductor energizes the first circuit means for a first visible indication of voltage status and energizes the second circuit means for a second indication of voltage status.

BRIEF DESCRIPTION OF THE DRAWINGS

In drawings which illustrate by way of example only an embodiment of the present invention, FIG. 1 a cross-sectional view of a typical loadbreak elbow.

DETAILED DESCRIPTION OF THE INVENTION

Figure 1:
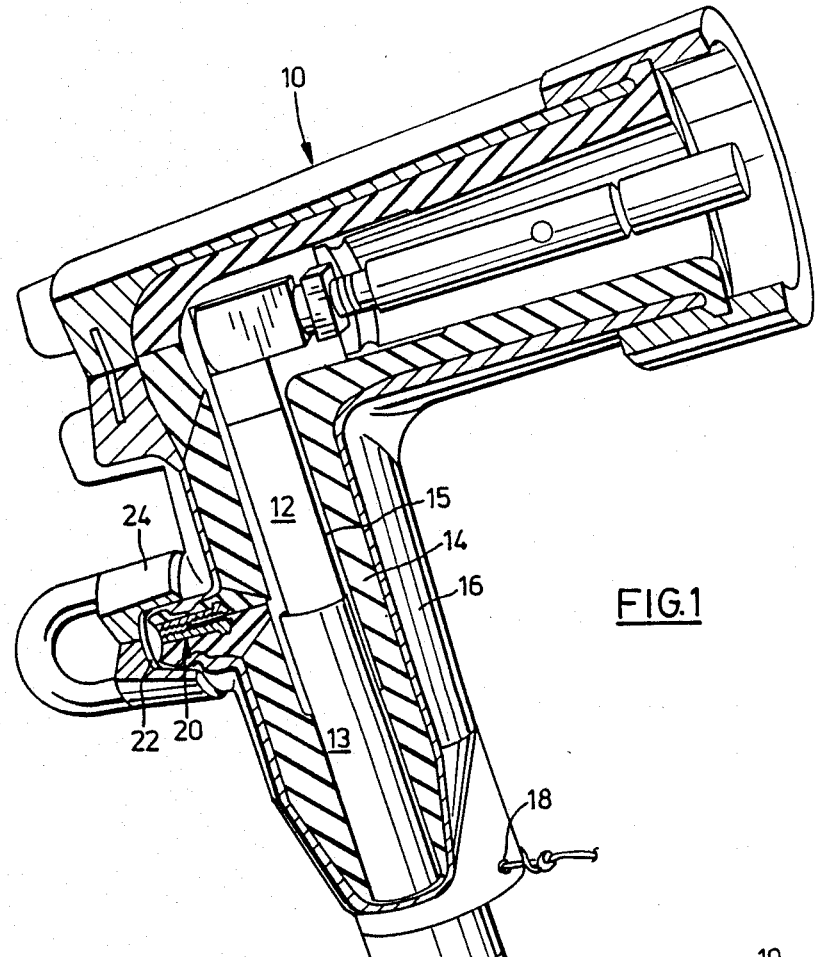

Referring to FIG. 1, a typical loadbreak elbow 10 includes a conductor 12 surrounded by an insulator 13, a semiconductive layer 15 and then an insulating sheath 14, all encased in a semiconductive outer shield 16. The shield 16 has a drain wire terminal 18 for grounding the shield 16 to a cable concentric neutral webbing (not shown) encased in the outer jacket of the cable 17.

A conductive test point terminal 20 is embedded in the insulating sheath 14 and extends through the shield 16, being exposed exterior thereto, as at contact 22. An insulating cap 24 sealingly engages the shield 16 about the test point terminal 20 to protect the terminal 20 from environmental conditions.

Figure 4:
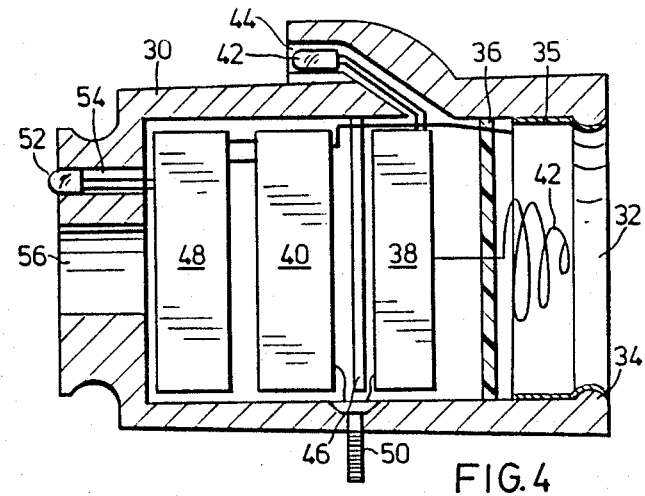
FIG. 4 is a cross-sectional view of the housing of the invention illustrated in FIG. 2.

In a preferred embodiment, the potential indicating device of the present invention, as illustrated in FIG. 4, includes an insulating housing 30 having at one end an opening 32 adapted to engage the portion 26 of the shield 16 surrounding the test point terminal 20. Encircling the opening 32 is a lip 34 compatible with a channel 28 circumscribing the portion 26 of the shield 16, such that the opening 32 in the housing 30 will sealingly engage over the portion 26 of the shield 16. A conductive sheath 35 composed of metallic foil or other suitable material is sealed to the lip 34 and connected to an input terminal of an electrical circuit 40.

An electrically insulating barrier 36 positioned within the inner wall of housing 30 adjacent to the opening 32 isolates electrical circuits 38, 40 from the shield 16. A conductive helical spring 42 is disposed essentially concentric with the axis of the housing 30 for engagement with the electrical contact 22 of test point terminal 20 when the housing 30 is engaged about the portion 26 of the shield 16. The terminus of spring 42 projects through the barrier 36 for connection to an input terminal of a first indicator circuit 38 mounted in the housing 30. A visible indicator 42, such as a neon lamp, is presented for viewing through a window 44 in the housing 30.

A second indicator circuit 40 is similarly mounted in the housing 30, and may be separated from the first indicator circuit 38 by a divider 46. A terminal 50 projects through the housing 30 for connecting an input terminal of each of the first and second indicator circuits 38, 40 to the cable concentric neutral webbing for grounding.

An audible indicator 48, such as a submersible piezoelectric alarm, is mounted in the housing 30 at a suitable location. The particular arrangement illustrated of the circuits 38, 40 and the alarm 48 within the housing 30 is preferred, although other arrangements may also be suitable.

Figure 2:
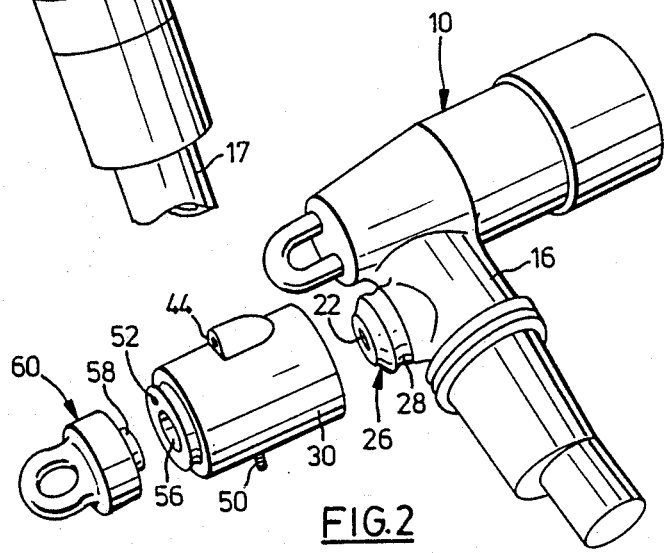
FIG. 2 is a perspective view of the loadbreak elbow of FIG. 1 including a partly exploded view of a device in accordance with the present invention.

As illustrated in FIG. 4, switching means 52 comprises a photo-sensitive transistor which projects through an orifice 54 in the housing 30. An opening 56 in the housing 30 is adapted to removably receive a stem 58 projecting from a plug 60 which, when engaged with the housing 30, prevents light from striking the photosensitive transistor 52, as illustrated in exploded view in FIG. 2. The operation of the switching means 52 is described in more detail below.

The indicator activated by the first circuit is a visible indicator 42, since the current available from the test point terminal is very small, in the order of microamps, and thus unable to drive other known indicators. Preferably the indicator activated by the second circuit is an audible indicator 48. The first and second indicator circuits 38, 40 will hereinafter be referred to as the visible indicator circuit 38 and the audible indicator circuit 40, respectively, although various combinations of known indicators can be connected to the second indicator circuit 40 to effect the desired result.

Figure 3:
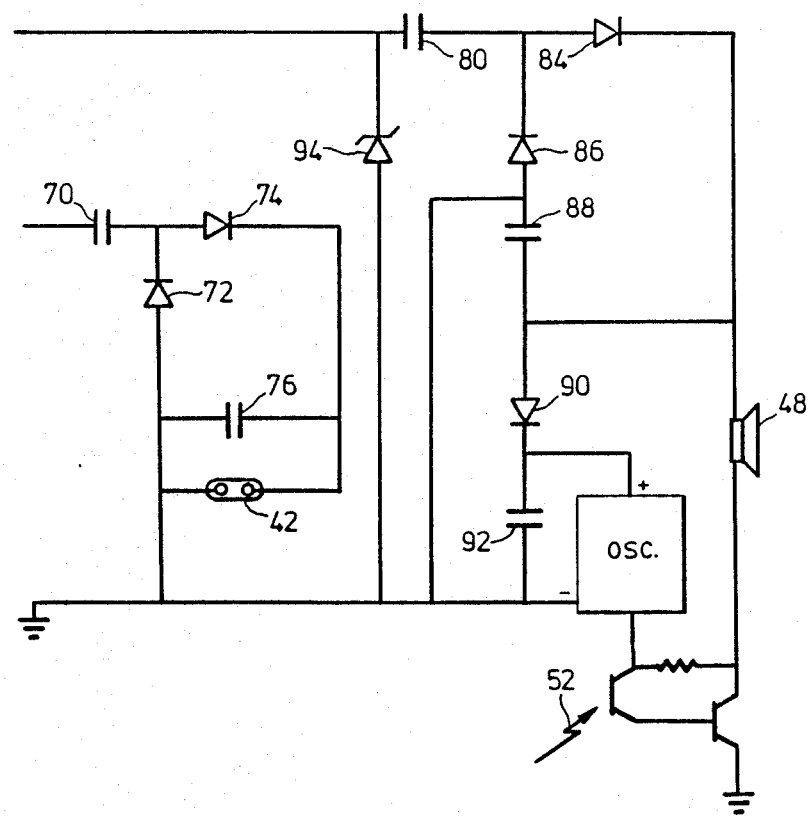
FIG. 3 is a schematic representation of a preferred embodiment of the first and second indicating circuits of the present invention.

FIG. 3 schematically illustrates a preferred embodiment of the visible and audible indicator circuits 38, 40. The visible indicator circuit 38 has an input terminal connected to ground, and an input terminal connected to the conductive spring 42, and a voltage doubler and rectifier comprising capacitors 70, 76 and diodes 72, 74. When an alternating voltage is present on the conductor 12, a proportional alternating voltage is capacitively coupled to the test point terminal 20, which is transmitted through terminal contact 22 and spring 42 to the rectifier. The thus rectified voltage charges capacitor 76, increasing the voltage level until the charge on the capacitor 76 attains the flash threshold of the neon lamp 42, at which point the capacitor 76 discharges and the neon lamp 42 emits a flash of light. So long as a voltage is present on the conductor 12, the neon lamp 42 will flash intermittently as the capacitor 76 continually charges and discharges. The periodic flashing of the neon lamp 42 increases proportionately with the voltage on the conductor 12.

The audible indicator circuit 40 has an input terminal connected to ground, an input terminal connected to the outer semiconductive shield 16 of the elbow through conductive sheath 35, and output terminals connected to an audible alarm 48. The circuit includes a voltage doubler and rectifier comprising capacitors 80, 88 and diodes 84, 86, and a low power oscillator driven by capacitor 92. Switching means 52 is preferably introduced between the grounded input terminal and the audible alarm 48. This permits the audible indicator circuit to be activated manually only when needed, in order to avoid the possible annoyance of a perpetually sounding alarm. An alternating voltage on the conductor capacitively couples a proportional alternating voltage on the shield, which is rectified by diodes 84, 86 and, when the switching means 52 is closed, activates the audible alarm 48.

As indicated earlier, switching means preferably comprises a photo-sensitive transistor 52 presented through an orifice 54 in the end of the housing 30. The cap 60 when engaged with the housing 30 prevents light from striking the photo-sensitive transistor 52, which opens the audible indicator circuit 40 and thereby deactivates the audible alarm 48.

Service personnel examining the status of the connector will first view the indicator lamp 42 for intermittent flashing. If the indicator lamp 42 is not flashing, this may indicate either that there is no voltage on the conductor 12 or that the visible indicator circuit 38 has failed. In order to determine which condition exists, service personnel may remove the cap 60 from the end of the housing 30, exposing the photo-sensitive transistor 52 to natural or artificial light and thereby closing the audible indicator circuit 40. If the audible alarm 48 does not sound, service personnel can be virtually assured that there is no voltage on the conductor 12, since the likelihood of both the visible indicator circuit 38 and the audible indicator circuit 40 malfunctioning concurrently is extremely low.

Having thus determined the status of the elbow, service personnel can replace the cap 60 to open the audible indicator circuit 40 and deactivate the audible alarm 48.

Because the outer semiconductive shield 16 is capacitively coupled to the conductor 12, the shield 16 is typically grounded through the drain wire terminal 18. When the audible indicator circuit 40 is activated, the shield 16 is grounded through the audible indicator circuit 40 and terminal 50. Circuit means may be provided for grounding the shield 16 if the audible indicator circuit 40 malfunctions, which may include a bipolar zener diode 94, as illustrated in FIG. 3, bridging the terminal 50 and the drain wire terminal 18.

Having described a preferred embodiment of the invention, it will be obvious to those skilled in the art that various alterations and modifications may be made to the invention so described without departing from the scope thereof.

We claim:

1. A potential indicating device for indicating the presence of a voltage on a connector in a high voltage distribution system, the connector comprising a conductor surrounded by an insulating sheath encased in a semiconductive shield and having a test point terminal embedded in the insulating sheath and exposed for contact from outside of the shield, whereby a voltage on the conductor capacitively couples a first voltage in the test point terminal and a second voltage in the shield, comprising a housing for connection to the shield having a window for viewing a visible indicator, containing a first circuit means having input terminals for connection to the test point terminal and ground, respectively, and output terminals connected to a first visible indicator, and a second circuit means having input terminals for connection to the connector shield and ground, respectively, and output terminals connected to a second indicator, wherein a voltage on the conductor energizes the first circuit means for a first visible indication of voltage status and energizes the second circuit means for a second indication of voltage status.

2. A potential indicating device as defined in claim 1 wherein the second indicator is an audible indicator.

3. A potential indicating device as defined in claim 2 including switching means for activating the second circuit means.

4. A potential indicating device as defined in claim 3 wherein the housing has a first open end adapted to engage the connector shield about the test point terminal and a second end adapted to receive a plug, and the switching means comprises a photo-sensitive transistor presented through the second end of the housing such that the plug when engaged with the housing prevents exposure of the photo-sensitive transistor to light.

5. A potential indicating device as defined in claims 2, 3 or 4 wherein the visible indicator is a neon lamp presented for viewing through the window in the housing.

6. A potential indicating device for indicating the presence of voltage on a connector in a high voltage distribution system, the connector comprising a conductor surrounded by an insulating sheath encased in a semiconductive shield and having a test point terminal embedded in the insulating sheath and exposed for contact from outside of the shield, whereby a voltage on the conductor capacitively couples a first voltage on the test point terminal and a second voltage on the shield, comprising a housing having a first open end adapted to engage the connector shield, a second end, and a window for viewing a visible indicator, containing a first circuit means having input terminals connected to the test point terminal and ground, respectively, and output terminals connected to the visible indicator, and a second circuit means having input terminals connected to the connector shield and ground, respectively, and output terminals connected to an audible indicator, wherein a voltage on the conductor energizes the first circuit means for a visible indication of voltage status and energizes the second circuit means for an audible indication of voltage status.

7. A potential indicating device as defined in claim 6 including switching means for closing the second circuit.

8. A potential indicating device as defined in claim 7 wherein switching means comprises a photo-sensitive transistor presented through the second end of the housing and a plug adapted to removably engage the second end of the housing and prevent exposure of the photo-sensitive transistor to light.

9. A potential indicating device as defined in claims 6, 7 or 8 wherein the visible indicator is a neon lamp presented for viewing through the window in the housing.

* * * * *